(12) United States Patent
Ohtani

(10) Patent No.: US 6,972,435 B2
(45) Date of Patent: Dec. 6, 2005

(54) CAMERA HAVING DISPLAY DEVICE UTILIZING TFT

(75) Inventor: Hisashi Ohtani, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/872,375

(22) Filed: Jun. 22, 2004

(65) Prior Publication Data

US 2004/0232423 A1 Nov. 25, 2004

Related U.S. Application Data

(60) Continuation of application No. 10/657,137, filed on Sep. 9, 2003, which is a division of application No. 09/967,697, filed on Sep. 28, 2001, now Pat. No. 6,657,228, which is a continuation of application No. 08/862,895, filed on May 23, 1997, now Pat. No. 6,316,787.

(30) Foreign Application Priority Data

Jun. 4, 1996 (JP) .................................. 8-165272

(51) Int. Cl.[7] .......................................... H01L 31/0392
(52) U.S. Cl. ...................... 257/72; 257/59; 257/347; 257/411; 438/151; 438/166; 438/283; 438/287
(58) Field of Search ............................ 257/59, 61, 66, 257/69, 72, 67, 70, 410–411; 438/149, 151, 438/157, 166, 283, 216, 261, 287

(56) References Cited

U.S. PATENT DOCUMENTS 4,347,586 A 8/1982 Natsui
4,409,724 A 10/1983 Tasch, Jr. et al.
4,651,406 A 3/1987 Shimizu et al.
4,808,845 A 2/1989 Suzuki et al.
4,823,180 A 4/1989 Wieder et al.
4,851,370 A 7/1989 Doklan et al.
4,886,962 A 12/1989 Gofuku et al.
5,169,792 A 12/1992 Katoh et al.
5,292,675 A 3/1994 Codama
5,306,651 A 4/1994 Masumo et al.
5,343,066 A 8/1994 Okamoto et al.
5,365,079 A 11/1994 Kodaira et al.
5,440,163 A 8/1995 Ohhashi
5,468,987 A 11/1995 Yamazaki et al.
5,485,019 A 1/1996 Yamazaki et al.
5,497,021 A 3/1996 Tada
5,508,209 A 4/1996 Zhang et al.
5,521,107 A 5/1996 Yamazaki et al.
5,545,577 A 8/1996 Tada
5,563,427 A 10/1996 Yudasaka et al.
5,576,655 A 11/1996 Fujihira et al.

(Continued)

FOREIGN PATENT DOCUMENTS

JP 56-111258 9/1981

(Continued)

*Primary Examiner*—Donghee Kang
(74) *Attorney, Agent, or Firm*—Fish & Richardson P.C.

(57) ABSTRACT

A camera includes a display device which has thin film transistors (TFT). A gate insulating film of the TFT has a first insulating film including silicon oxide and a second insulating film including silicon nitride. A third insulating film including silicon nitride is formed over the first and second insulating films and a gate electrode. The third insulating film is in direct contact with an upper surface of an extending portion of the first insulating film and an upper surface of an extending portion of the second insulating film.

32 Claims, 11 Drawing Sheets

U.S. PATENT DOCUMENTS

| | | | |
|---|---|---|---|
| 5,595,922 | A | 1/1997 | Tigelaar et al. |
| 5,608,251 | A | 3/1997 | Konuma et al. |
| 5,616,935 | A | 4/1997 | Koyama et al. |
| 5,620,905 | A | 4/1997 | Konuma et al. |
| 5,623,157 | A | 4/1997 | Miyazaki et al. |
| 5,646,060 | A | 7/1997 | Chang et al. |
| 5,712,495 | A | 1/1998 | Suzawa |
| 5,719,065 | A | 2/1998 | Takemura et al. |
| 5,789,762 | A | 8/1998 | Koyama et al. |
| 5,804,878 | A | 9/1998 | Miyazaki et al. |
| 5,847,432 | A | 12/1998 | Nozaki |
| 5,849,611 | A | 12/1998 | Yamazaki et al. |
| 5,877,513 | A | 3/1999 | Koyama et al. |
| 5,879,969 | A | 3/1999 | Yamazaki et al. |
| 5,889,291 | A | 3/1999 | Koyama et al. |
| 5,917,225 | A | 6/1999 | Yamazaki et al. |
| 5,945,711 | A | 8/1999 | Takemura et al. |
| 5,962,872 | A | 10/1999 | Zhang et al. |
| 6,013,928 | A | 1/2000 | Yamazaki et al. |
| 6,031,290 | A | 2/2000 | Miyazaki et al. |
| 6,124,603 | A | 9/2000 | Koyama et al. |
| 6,147,375 | A | 11/2000 | Yamazaki et al. |
| 6,166,397 | A | 12/2000 | Yamazaki et al. |
| 6,166,414 | A | 12/2000 | Miyazaki et al. |
| 6,316,787 | B1 | 11/2001 | Ohtani |
| 6,335,555 | B1 | 1/2002 | Takemura et al. |
| 6,441,399 | B1 | 8/2002 | Koyama et al. |
| 6,448,612 | B1 | 9/2002 | Miyazaki et al. |
| 6,452,212 | B1 | 9/2002 | Codama et al. |
| 6,476,447 | B1 | 11/2002 | Yamazaki et al. |
| 6,492,685 | B1 | 12/2002 | Koyama et al. |
| 6,566,711 | B1 | 5/2003 | Yamazaki et al. |
| 6,599,791 | B1 | 7/2003 | Koyama et al. |
| 6,608,353 | B2 | 8/2003 | Miyazaki et al. |
| 6,624,450 | B1 | 9/2003 | Yamazaki et al. |
| 6,657,228 | B2 | 12/2003 | Ohtani |
| 6,835,607 | B2 | 12/2004 | Takemura et al. |
| 2002/0011598 | A1 | 1/2002 | Yamazaki et al. |
| 2002/0051382 | A1 | 5/2002 | Matsubara et al. |
| 2002/0163043 | A1 | 11/2002 | Zhang et al. |
| 2002/0179969 | A1 | 12/2002 | Miyazaki et al. |
| 2002/0195634 | A1 | 12/2002 | Koyama et al. |
| 2003/0042559 | A1 | 3/2003 | Takemura et al. |
| 2003/0094656 | A1 | 5/2003 | Koyama et al. |
| 2003/0173570 | A1 | 9/2003 | Yamazaki et al. |
| 2004/0023445 | A1 | 2/2004 | Miyazaki et al. |
| 2004/0051102 | A1 | 3/2004 | Miyazaki et al. |
| 2005/0040476 | A1 | 2/2005 | Takemura et al. |

FOREIGN PATENT DOCUMENTS

| | | |
|---|---|---|
| JP | 03-020046 | 1/1991 |
| JP | 03-095938 | 4/1991 |
| JP | 03-095939 | 4/1991 |
| JP | 05-308128 | 11/1993 |
| JP | 06-291314 | 10/1994 |
| JP | 07-130974 | 5/1995 |
| JP | 07-135323 | 5/1995 |
| JP | 07-169974 | 7/1995 |
| JP | 07-169975 | 7/1995 |
| JP | 07-218932 | 8/1995 |
| JP | 07-273349 | 10/1995 |
| KR | 93-0005248 | 3/1993 |
| KR | 93-0018736 | 9/1993 |
| KR | 94-0016642 | 7/1994 |
| KR | 1995-0033582 | 12/1995 |

CAMERA HAVING DISPLAY DEVICE UTILIZING TFT

CROSS-REFERENCE TO RELATED APPLICATION

This application is a continuation application of U.S. application Ser. No. 10/657,137, filed on Sep. 9, 2003, which is a divisional application of U.S. application Ser. No. 09/967,697, filed on Sep. 28, 2001, now U.S. Pat. No. 6,657,228, which is a continuation of U.S. application Ser. No. 08/862,895, filed on May 23, 1997, now U.S. Pat. No. 6,316,787, which claims the benefit of a foreign priority application filed in Japan as Ser. No. 8-165272, on Jun. 4, 1996, all of which are incorporated by reference.

BACKGROUND OF THE INVENTION

The present invention relates to a semiconductor integrated circuit having a plurality of thin film transistors (TFT) and more particularly to a monolithic active matrix circuit having an active matrix circuit and a logic circuit (called also as a peripheral circuit) for driving it on one and the same substrate and to a fabrication method thereof. The semiconductor integrated circuit fabricated by the present invention may be formed either on an insulating substrate such as glass and on an insulating coating film formed on a semiconductor substrate such as monocrystal silicon for example. The present invention exhibits its effect specifically in a semiconductor integrated circuit having a large matrix which operates at low speed and a logic circuit for driving it which is required to operate at high speed, such as a liquid crystal display.

DESCRIPTION OF RELATED ART

Recently, researches on an insulated gate type semiconductor device having a thin film semiconductor layer (also called as an active layer) on an insulating substrate are being conducted and specifically, researches on a thin film insulated gate transistor, i.e. a so-called thin film transistor (TFT), are being actively conducted. They are categorized as an amorphous silicon TFT or a crystal silicon TFT depending on a material and a crystal state of the semiconductor to be used.

Generally, a semiconductor in the amorphous state has a small field mobility, so it cannot be utilized for a TFT which is required to operate at high speed. Then, research and development on the crystal silicon TFT are being conducted in order to fabricate a higher performance circuit in these days.

In those TFTs, a thin film semiconductor region of each individual thin film transistor is isolated and hence, the channel portion has not been grounded like the conventional semiconductor integrated circuit on a semiconductor chip. Due to that, deterioration or failure peculiar to the TFT have occurred sometimes. For instance, with regard to a hot carrier implantation phenomenon, it has been extremely difficult to remove accumulated charge because the channel has been put in the state of floating potential.

Then, a gate insulating film has been thickened or applied voltage has been reduced in order to prevent the deterioration and the like caused by the implantation of carrier. However, operating speed decreases if the gate insulating film is thickened. It has been also difficult to reduce the applied voltage because of the requirement of a device. Because driving voltage of a matrix circuit is determined depending on a liquid crystal material in the monolithic active matrix circuit used for a liquid crystal display in particular, it is difficult to change it arbitrarily.

However, the operating speed of the logic circuit decreases if the gate insulating film is thickened. Then, driving voltage has to be increased to maintain the operating speed, increasing power consumption.

FIG. 11A is a block diagram showing the monolithic active matrix circuit used for a liquid crystal display. In the figure, a column driver 1 and a row driver 2 are provided on a substrate 7 as peripheral driver circuits, pixel circuits (pixels) 4 each comprising a transistor and a capacitor are formed in a matrix area 3 and the matrix area is connected with the peripheral circuits through wires 5 and 6.

Among the TFTs used for the driver circuits, high operating speed is required to the TFT composing the logic circuit such as a shift register and high withstand voltage is required to the TFT used in the pixel circuit. Even in the driver circuits, a part of transistors in a switching circuit (e.g. buffer circuit) is required to have high withstand voltage, rather than high operating speed.

Because the high operating speed and the high withstand voltage are contradictory requirements as described above, it has been difficult to form those transistors on one and the same substrate in one and the same process especially when it is required to reduce the power consumption. Accordingly, it is an object of the present invention to solve such difficult problems.

SUMMARY OF THE INVENTION

The present invention is characterized in that a thickness of a gate insulating film in a circuit in which priority is given to high operating speed is changed from that of a gate insulating film in a circuit in which priority is given to high withstand voltage. That is, the former is made to be a circuit which is driven in low voltage and operates at high speed and the latter is made to be a circuit having high withstand voltage by reducing the thickness of the gate insulating film of the former as compared to that of the latter.

In this case, among peripheral circuits, the circuits in which priority is given to high operating speed include logic circuits such as a shift register, a CPU, a memory circuit and a decoder circuit. Further, among peripheral circuits, the circuits in which priority is given to high withstand voltage include a high withstand voltage switching circuit, a buffer circuit and others.

A matrix circuit is also the circuit in which priority is given to high withstand voltage, though it is not the peripheral circuit.

Their difference is distinguished by a variation of voltage applied to the gate electrode in general. That is, the width of variation of voltage applied to the gate electrode is small in the former rather than in the latter.

Then, a semiconductor integrated circuit of a first invention is characterized in that a thickness of at least one gate insulating film of the thin film transistor of the circuit in which priority is given to high operating speed is 80% or less of a thickness of a gate insulating film of the thin film transistor of the circuit in which priority is given to high withstand voltage.

A semiconductor integrated circuit of a second invention is characterized in that at least one layer of another insulating layer is used for at least one gate insulating film of the thin film transistor of the circuit in which priority is given to high withstand voltage in addition to an insulating layer composing at least one gate insulating film of the thin film transistor of the circuit in which priority is given to high operating speed.

A semiconductor integrated circuit of a third invention is characterized in that when at least one gate insulating film of the thin film transistor of the circuit in which priority is given to high operating speed is assumed to be a first insulating layer, at least one gate insulating film of the thin film transistor of the circuit in which priority is given to high withstand voltage is composed of, in addition to the first insulating layer, a second insulating layer formed in a different process from the first insulating layer.

A semiconductor integrated circuit of a fourth invention is characterized in that in the semiconductor integrated circuit having a first thin film transistor and a second thin film transistor each having a gate insulating film whose thickness is different, the thickness of the gate insulating film of the first thin film transistor is 80% or less of the thickness of the gate insulating film of the second thin film transistor and a length of a channel of the first thin film transistor is 80% or less of a length of a channel of the second thin film transistor.

The semiconductor integrated circuit of the fourth invention is also characterized in that the thin film transistor used in the peripheral circuit which is required to operate at high speed is micronized in accordance to scaling law.

Specifically, the present invention is characterized in that the length of the channel in the circuit in which priority is given to high operating speed is changed from that of the channel in the circuit in which priority is given to high withstand voltage. That is, the length of the channel of the former is shortened as compared to that of the latter, or the length of the channel of the latter is prolonged as compared to that of the former, so as to make the former a transistor which is driven in low voltage and which operates at high speed and the latter a transistor of high withstand voltage.

Here, the scaling law to reduce physical dimensions of the TFT or wiring composing it, an interlayer film and others in inversely proportional to a certain coefficient. It allows enhancement of performance to be achieved in the same time with highly densified separation of devices.

According to the present invention, electrical characteristics of the peripheral circuit which is required to operate at high speed is improved by micronizing the channel length and the thickness of the gate insulating film in particular.

The micronization of the channel length may be achieved by modifying a shape of a mask in forming the gate electrode.

In the first through fourth invention described above, it is possible to include a low concentration impurity region that is formed by utilizing a difference of the thickness of the gate insulating films in the thin film transistor of the circuit in which priority is given to high withstand voltage. It allows high withstand voltage characteristics to be enhanced further.

Further, in the third invention described above, the chemical composition of the first insulating layer may be differentiated from that of the second insulating layer. Thereby, it becomes advantageous in fabricating them.

Similarly to that, in the third invention described above, only either one of the first insulating layer or the second insulating layer may be formed by means of thermal oxidation. It is of course possible to form the both by means of the thermal oxidation.

As for a method for fabricating the inventive semiconductor integrated circuit, there are the following inventions. The fifth invention comprises steps of:

1) forming a thin film semiconductor region utilized for a thin film transistor of a circuit in which priority is given to high withstand voltage and a thin film semiconductor region utilized for a thin film transistor of a circuit in which priority is given to high operating speed;

2) forming a first insulating layer covering both of the thin film semiconductor regions;

3) selectively removing the first insulating layer to remove all the first insulating layer covering the thin film semiconductor region composing at least one of the thin film transistor of the circuit in which priority is given to high operating speed by; and 4) forming a second insulating layer covering both of the thin film semiconductor regions.

The sixth invention comprises steps of:

1) forming a thin film semiconductor region utilized for a thin film transistor of a circuit in which priority is given to high withstand voltage and a thin film semiconductor region utilized for a thin film transistor of a circuit in which priority is given to high operating speed;

2) forming a first insulating layer covering both of the thin film semiconductor regions;

3) forming a second insulating layer covering the first insulating layer; and 4) selectively removing the second insulating layer to remove all the first insulating layer covering the thin film semiconductor region composing at least one of the thin film transistor of the circuit in which priority is given to high operating speed.

The seventh invention comprises steps of:

1) forming a thin film semiconductor region utilized for a thin film transistor of a circuit in which priority is given to high withstand voltage and a thin film semiconductor region utilized for a thin film transistor of a circuit in which priority is given to high operating speed;

2) selectively forming a first insulating layer covering both of the thin film semiconductor region except part of the thin film semiconductor region composing at least one of the thin film transistors of at least the circuit in which priority is given to high operating speed; and 3) forming a second insulating layer covering both of the thin film semiconductor regions.

In the fifth through seventh inventions described above, the first insulating layer may be formed by means of thermal oxidation. The second insulating layer may be also formed by means of thermal oxidation as a matter of course.

The fifth through seventh inventions described above may further comprise a step of forming gate electrodes whose width is different owing to shapes of mask of the gate electrodes so that the width of the gate electrode of the second thin film transistor is larger than the width of the gate electrode of the first thin film transistor.

It also comprises a step of forming a channel region having almost the same width with the width of the gate electrode under the gate electrode in a step of doping to the active layer.

While the length of the channel of the first thin film transistor has been set to be 80% or less of the length of the channel of the second thin film transistor, it has been found that the electrical characteristics such as operating speed improves when the ratio of the length of the channel of the first thin film transistor to that of the second thin film transistor is set preferably at 0.1 to 0.5.

Therefore, the ratio of the width of the gate electrode of the first thin film transistor to the width of the gate electrode of the second thin film transistor has been set within a range of 0.1 to 0.5.

The electrical characteristics such as operating speed improves further when the thickness of the gate insulating film of the first thin film transistor and the second thin film transistor is adjusted in accordance to this ratio.

Thereby, the thickness of the gate insulating film or the channel length may be changed in the circuit which is required to operate at high speed (e.g. a logic circuit in a monolithic active matrix circuit) and the circuit which is required to have high withstand voltage (a matrix circuit in the monolithic active matrix circuit). As a result, as for the monolithic active matrix circuit, the logic circuit which is driven in low voltage and operates at high speed and the high withstand voltage matrix circuit may be obtained on one and the same substrate, which is the purpose of the present invention. It is noted that as disclosed in, for example, Japanese Patent Laid Open No. Hei. 7-135323, the disclosure of which is herein incorporated by reference, the present invention is applicable to a semiconductor integrated circuit in which various memories and arithmetic devices are provided as logic circuits on one and the same substrate (see FIG. 11B). In FIG. 11B, a correction memory 8, a memory 9, an input port 10, a CPU 11, and an XY branch 12 are formed on a substrate 7 as well as a column decoder/driver 1, a row decoder/driver 2, and an active matrix 3. The present invention will be explained below in detail with reference to preferred embodiments.

BRIEF DESCRIPTION OF DRAWINGS

FIGS. 10A through 10C are section views of the fabrication process of the sixth embodiment using a resist film to selectively obtain a thermal oxide film;

DESCRIPTION OF PREFERRED EMBODIMENTS

[First Embodiment]

FIGS. 1A through 1F are section views showing a fabrication process according to the present embodiment. In FIGS. 1A through 1F, a logic circuit 101 is formed on the left side of the paper and a matrix circuit 102 on the right side. At first, a base film (not shown) of silicon oxide of 2000 Å in thickness is formed on a substrate (Corning 7059) 11 by means of sputtering. Further, an intrinsic (I-type) amorphous silicon film of 500 to 1500 Å in thickness, or 500 Å for example, is deposited by means of plasma CVD. Then, it is crystallized by means of known thermal annealing. It may be crystallized by a method of irradiating light energy beam such as laser light or a lamp, instead of the thermal annealing, or by using combinations of the methods. The method of irradiating with a lamp is called a rapid thermal annealing (RTA) method.

The silicon film thus obtained is patterned by means of photolithography to separate into islands to form island regions 12a and 12b for TFTs of a logic circuit and an island region 12c for a TFT of a matrix circuit.

Figure 1A:
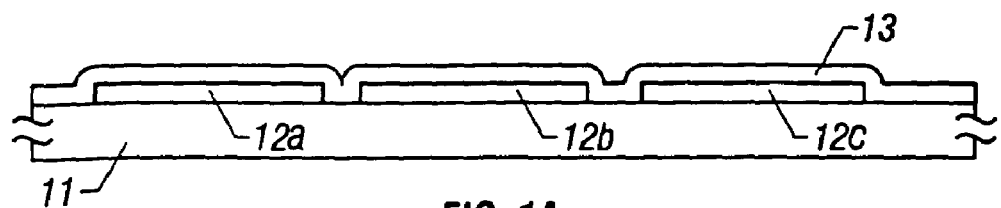
FIGS. 1A through 1F are section views showing a fabrication process according to a first embodiment.

Further, a silicon oxide film 13 of 1000 Å in thickness is deposited as a first gate insulating layer by means of sputtering. In the sputtering, silicon oxide is used as a target, a substrate temperature during the sputtering is 200 to 400° C., or 350° C. for example, and sputtering atmosphere composed of oxygen and argon is set to have a ratio of argon/oxygen=0 to 0.5, or 0.1 or less for example (FIG. 1A).

Figure 1B:
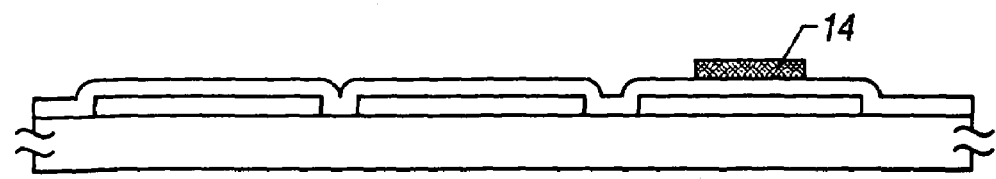

Further, a silicon nitride film of 1500 to 3000 Å in thickness is deposited by means of plasma CVD. It is then etched except a portion near a channel of the TFT of the matrix circuit to obtain a second gate insulating layer 14 (FIG. 1B).

Figure 1C:
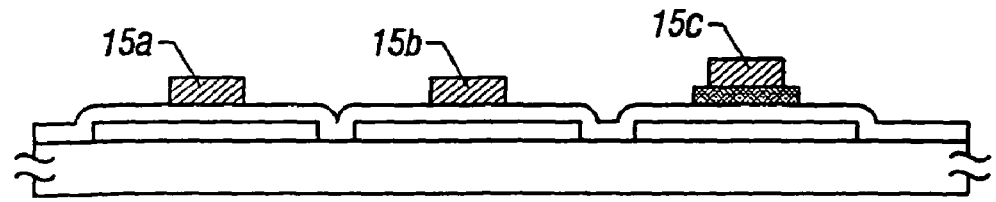

Following to that, a silicon film (containing 0.1 to 2% of phosphorus) of 3000 to 8000 Å in thickness, or 6000 Å for example, is deposited by means of low pressure CVD. Then, it is etched to form gate electrodes 15a, 15b and 15c (FIG. 1C).

Figure 1D:
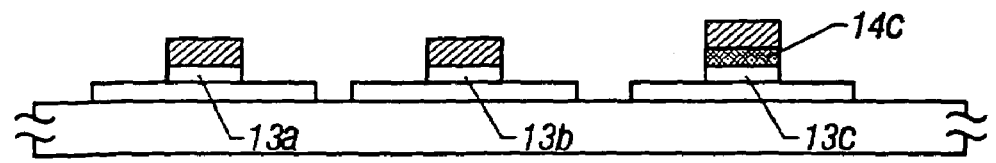

The first gate insulating layer and the second gate insulating layer are then etched by using the respective gate electrodes as a mask to expose the surface of the island-like semiconductor regions. As a result, gate insulating films comprising the first gate insulating layers 13a and 13b (both used for the logic circuit) and a gate insulating film comprising the first gate insulating layer 13c and the second gate insulating layer 14c (used for the matrix circuit) are obtained (FIG. 1D).

Next, impurities (phosphorus and boron) are implanted to the silicon region by using the gate electrodes as a mask by means of known ion doping. Phosphine ($PH_3$) and diborane ($B_2H_6$) are used as the doping gas and the dosage thereof is $1\times10^{15}$ to $8\times10^{15}$ cm$^{-2}$, e.g. $2\times10^{15}$ cm$^{-2}$ of phosphorus and $5\times10^{15}$ cm$^{-2}$ of boron. As a result, a P-type impurity region 16a and N-type impurity regions 16b and 16c are formed.

After that, the impurities are activated by means of laser annealing. Although a KrF excimer laser (wavelength: 248 nm, pulse width: 20 nsec) is used as the laser, other lasers such as a XeF excimer laser (wavelength: 353 mm), a XeCl excimer laser (wavelength: 308 nm), an ArF excimer laser (wavelength: 193 nm) and the like may be used. Energy density of the laser is 200 to 400 mJ/cm$^2$, or 250 mJ/cm$^2$ for example, and the laser is irradiated by 2 to 10 shots, or 2 shots for example, per one spot. The substrate is heated up to 100 to 450° C., or 250° C. for example, in irradiating the laser. Further, this activation can be also performed by the RTA method.

Figure 1E:
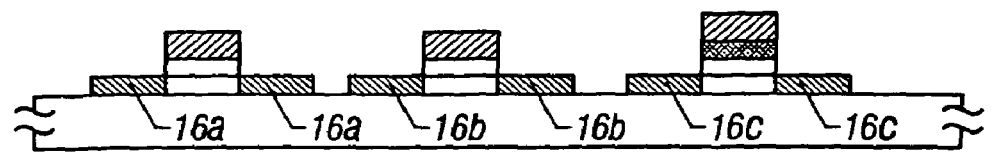

Thus the impurity regions 16a through 16c are activated. This step may be carried out also by means of thermal annealing (FIG. 1E). Further, this activation can be also performed by the RTA method.

Following to that, a silicon oxide film 17 of 6000 Å in thickness is formed as an interlayer insulator by means of plasma CVD. Contact holes are formed therethrough and electrode/wires 18a and 18b for the logic circuit and an electrode/wire 18c for the matrix circuit are formed by using metallic materials such as a multi-layered film of titanium nitride and aluminum.

Further, an indium tin oxide film (ITO) of 500 to 1000 Å in thickness, or 800 Å for example, is formed by means of sputtering and is patterned to form a pixel electrode 19.

Figure 1F:
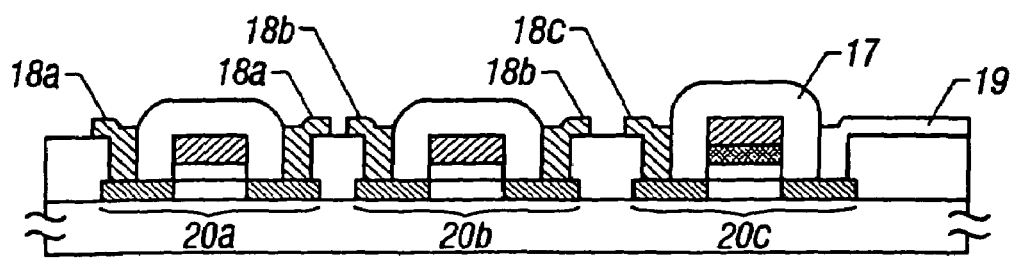

Finally, annealing is implemented at 350° C. for 30 minutes within one atmospheric pressure of hydrogen atmosphere. Through the above-mentioned steps, a semiconductor integrated circuit having a P-channel type TFT 20a and an N-channel type TFT 20b of the logic circuit and a TFT 20c of the matrix circuit is completed. It is noted that a buffer transistor of a driver circuit may be fabricated in the same manner with the transistor of the matrix circuit described in the above-mentioned embodiment (FIG. 1F).

[Second Embodiment]

FIGS. 2A through 2F are section views showing a fabrication process according to the present embodiment. In FIGS. 2A through 2F, a logic circuit 201 is formed on the left side of the paper and a matrix circuit 202 on the right side. At first, a base film (not shown) of silicon oxide of 2000 Å in thickness is formed on a substrate (Corning 7059) 21. Further, an intrinsic (I-type) crystalline silicon film of 500 to 1500 Å in thickness, or 500 Å for example, is deposited by means of plasma CVD. The silicon film is then separated into islands to form island regions 22a and 22b for TFTs of a logic circuit and an island region 22c for a TFT of a matrix circuit.

Figure 2A:
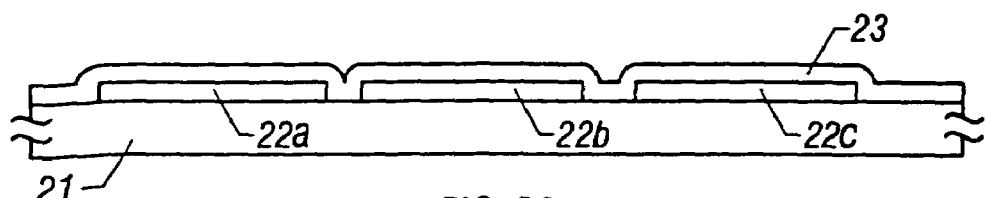
FIGS. 2A through 2F are section views showing a fabrication process according to a second embodiment.

Further, a silicon oxide film 23 of 1000 Å in thickness is deposited as a first gate insulating layer by means of plasma CVD (FIG. 2A).

Figure 2B:
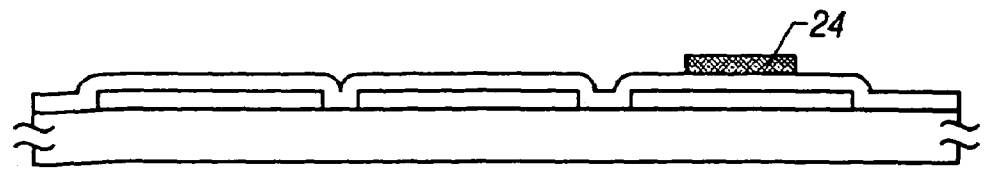

Further, a silicon nitride film of 1000 Å in thickness is deposited by means of plasma CVD. Then, the silicon nitride film is etched except a portion near a channel of the TFT of the matrix circuit. Here, the portion having a width of 5 μm from an edge of a gate electrode to be formed later is left. Thus, a second gate insulating layer 24 is obtained (FIG. 2B).

Figure 2C:
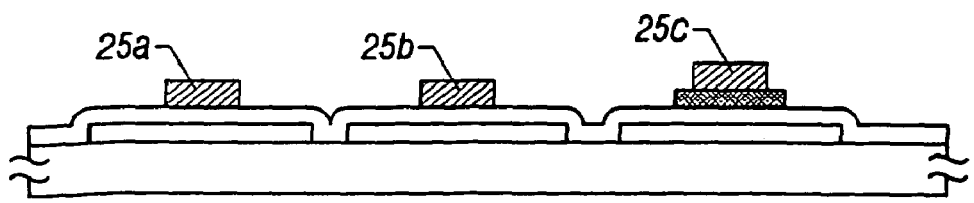

Following to that, a silicon film (containing 0.1 to 2% of phosphorus) of 3000 to 8000 Å in thickness, or 6000 Å for example, is deposited by means of low pressure CVD. It is then etched to form gate electrodes 25a, 25b and 25c (FIG. 2C).

Next, impurities (phosphorus and boron) are implanted to the silicon region by using the gate electrodes as a mask by means of known ion doping. Phosphine (PH$_3$) and diborane (B$_2$H$_6$) are used as the doping gas. Because through doping, i.e. doping carried out transmitting through a gate insulating film, is implemented in the present embodiment, acceleration voltage is increased more than that of the first embodiment.

Further, while the doping is implemented at higher acceleration voltage at the portion below the gate insulating layer 24 because the gate insulating film is thick there as compared to other parts, the dosage is lowered by 1 to 2 digits.

Figure 2D:
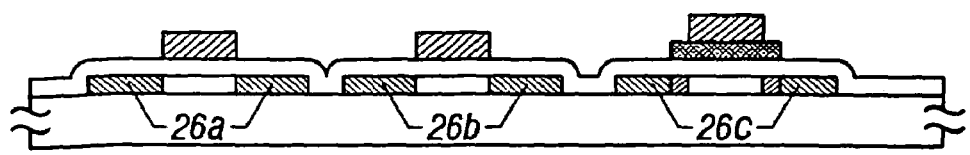

As a result, an N-type low concentration impurity region 26d is formed in addition to a P-type high concentration impurity region 26a and N-type high concentration impurity regions 26b and 26c. The technology for changing the concentration of impurity by utilizing a difference of thickness of gate insulating films has been disclosed in such as Japanese Patent Laid Open Nos. Hei. 7-169974, Hei. 7-169975, Hei. 7-218932, the disclosures of which are herein incorporated by reference (FIG. 2D).

Figure 2E:
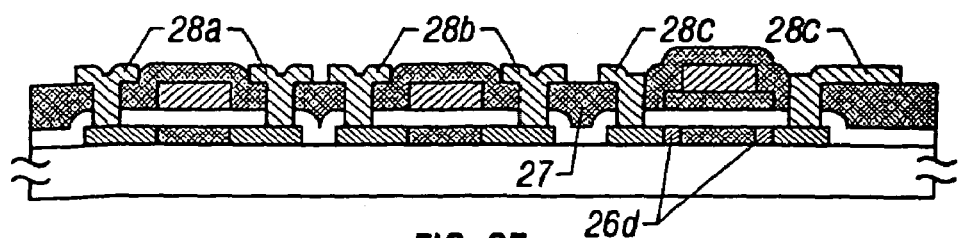

After activating the impurities, a silicon nitride film 27 of 4000 Å in thickness is formed as a first interlayer insulator by means of plasma CVD. Contact holes are formed therethrough and electrode/wires 28a and 28b for the logic circuit and an electrode/wire 28c for the matrix circuit are formed by using aluminum (FIG. 2E).

Further, an organic resin film 29 is formed as a second interlayer insulator. Then, after forming contact holes thereon, an indium tin oxide film (ITO) of 800 Å in thickness is formed by means of sputtering and is patterned to form a pixel electrode 30.

Figure 2F:
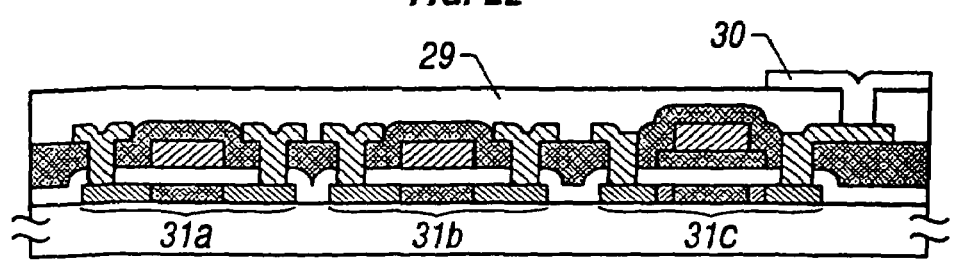

Through the above-mentioned steps, a semiconductor integrated circuit having a P-channel type TFT 31a and an N-channel type TFT 31b of the logic circuit and a TFT 31c of the matrix circuit is completed (FIG. 2F).

[Third Embodiment]

FIGS. 3A through 3F are section views showing a fabrication process according to the present embodiment. In FIGS. 3A through 3F, a logic circuit 301 is formed on the left side of the paper and a matrix circuit 302 on the right side. At first, an intrinsic (I-type) crystalline silicon film of 800 Å in thickness is formed on a substrate (quartz) 32. The silicon film is then separated into islands to form island regions 33a and 33b for TFTs of a logic circuit and an island region 33c for a TFT of a matrix circuit.

Figure 3A:
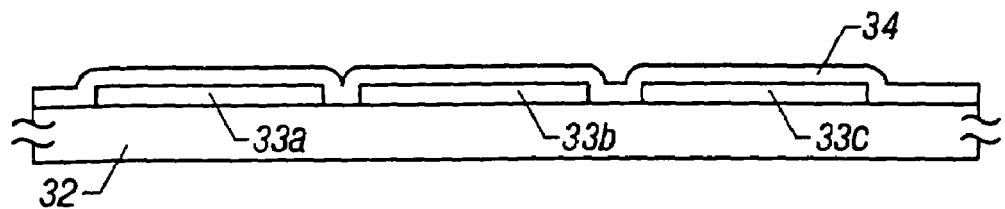
FIGS. 3A through 3F are section views showing a fabrication process according to a third embodiment.

Further, a silicon oxide film 34 of 1000 Å in thickness is deposited on the whole surface by means of plasma CVD (FIG. 3A).

Figure 3B:
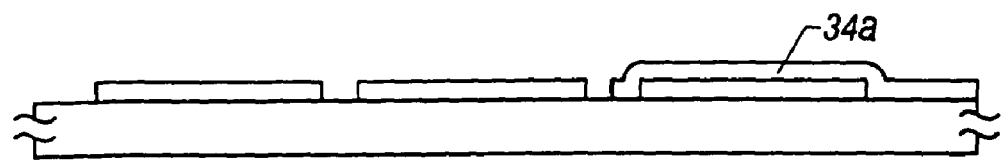

Next, the silicon oxide film 34 at the part of the logic circuit is etched to form a first gate insulating layer 34a in the matrix circuit region (FIG. 3B).

Figure 3C:
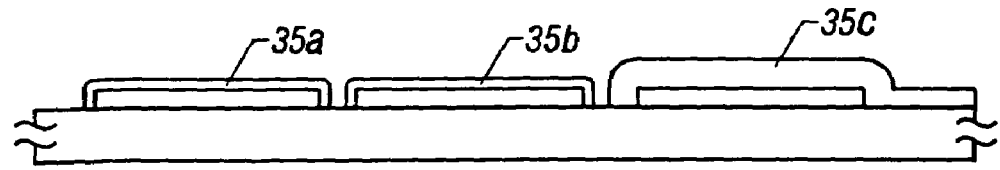

Following to that, a gate insulating film of silicon oxide is formed on the surface of the silicon region by implementing thermal oxidation in 850 to 1150° C., or at 950° C. for example. At this time, the silicon oxide is formed so as to be 500 Å in thickness in the logic circuit region thermally oxidized in the state in which the silicon layer has been exposed. Because the surface of the matrix circuit is covered by the silicon oxide film formed by means of the plasma CVD, the progress of the thermal oxidation is more moderate and a thickness of the whole silicon oxide is 1500 Å or less. Thus, gate insulating films 35a, 35b and 35c are obtained (FIG. 3C).

Figure 3D:
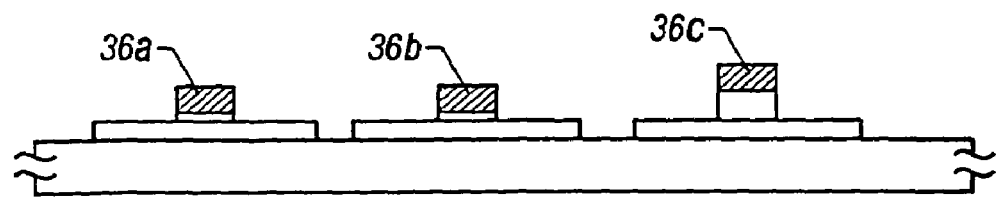

Following to that, an aluminum film of 4000 to 6000 Å, or 5000 Å in thickness for example, is deposited by means of sputtering. It is then etched to form gate electrodes 36a, 36b and 36c. Further, the gate insulating films 35a through 35c are etched by using the gate electrodes as a mask (FIG. 3D).

Figure 3E:
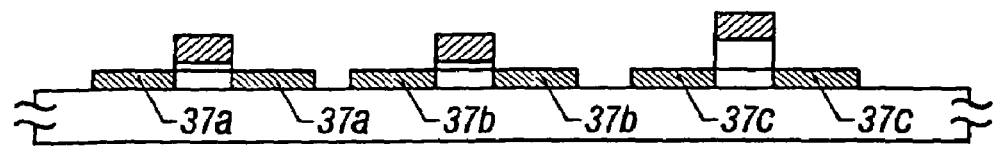

Next, impurities (phosphorus and boron) are implanted to the silicon region by using the gate electrodes as a mask by means of known ion doping to form a P-type impurity region 37a and N-type impurity regions 37b and 37c (FIG. 3E).

After activating the impurities, a silicon oxide film 38 of 4000 Å in thickness is formed as an interlayer insulator. Contact holes are formed therethrough and electrode/wires 39a and 39b for the logic circuit and an electrode/wire 39c for the matrix circuit are formed by aluminum.

Figure 3F:
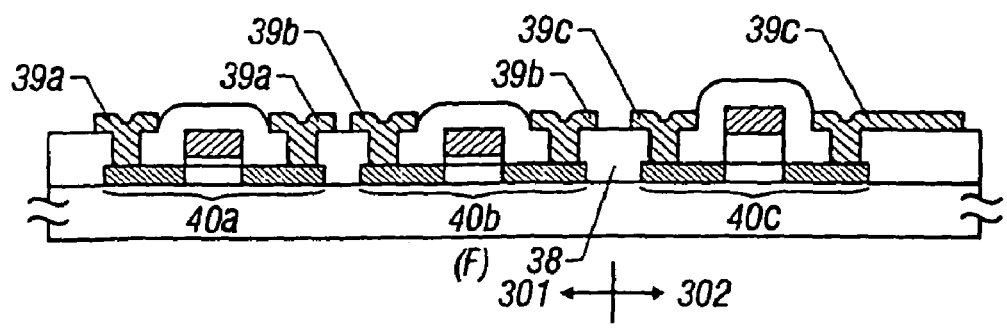

Through the above-mentioned steps, a semiconductor integrated circuit having a P-channel type TFT 40a and an N-channel type TFT 40b of the logic circuit and a TFT 40c of the matrix circuit is completed (FIG. 3F).

The pixel electrode may be added in the manner as described in the second embodiment.

[Fourth Embodiment]

FIGS. 4A through 4F are section views showing a fabrication process according to the present embodiment. In FIGS. 4A through 4F, a logic circuit 401 is formed on the left side of the paper and a matrix circuit 402 on the right side. At first, an intrinsic (I-type) crystal silicon film of 600 Å in thickness is formed on a substrate (quartz) 41. The silicon film is then separated into islands to form island regions 42a and 42b for TFTs of a logic circuit and an island region 42c for a TFT of a matrix circuit.

Figure 4A:
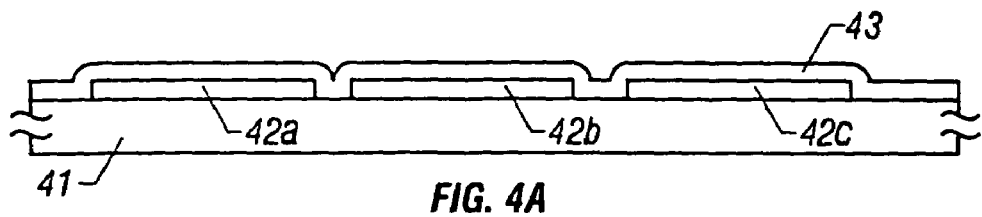
FIGS. 4A through 4F are section views showing a fabrication process according to a fourth embodiment.

Further, a silicon oxide film 43 of 1000 Å in thickness is deposited on the whole surface by means of plasma CVD (FIG. 4A).

Figure 4B:
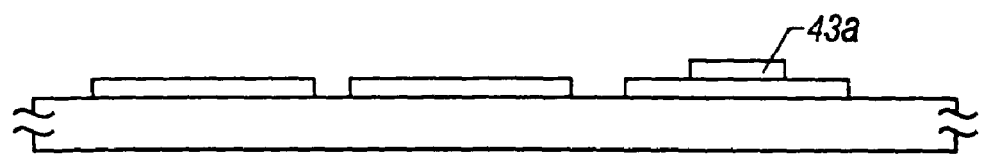

Next, the silicon oxide film 43 is etched except a portion near a channel of the TFT of the matrix circuit. Here, the portion having a width of 3 µm from the edge of a gate electrode to be formed later is left. Thus, a first gate insulating layer 43a is formed in the matrix circuit region (FIG. 4B).

Figure 4C:
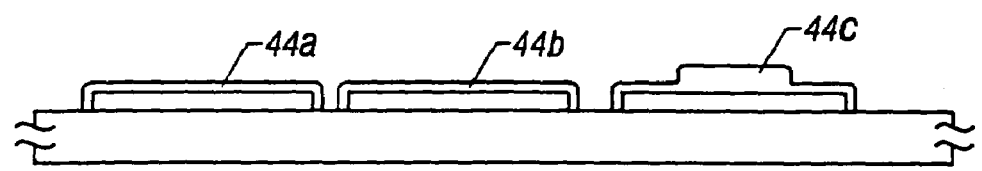

Following to that, a gate insulating film of silicon oxide is formed on the surface of the silicon region by implementing thermal oxidation at 950° C. At this time, the silicon oxide is formed to be 400 Å in thickness in the logic circuit region thermally oxidized in the state in which the silicon layer has been exposed. Thus, gate insulating films 44a, 44b and 44c are obtained (FIG. 4C).

Figure 4D:
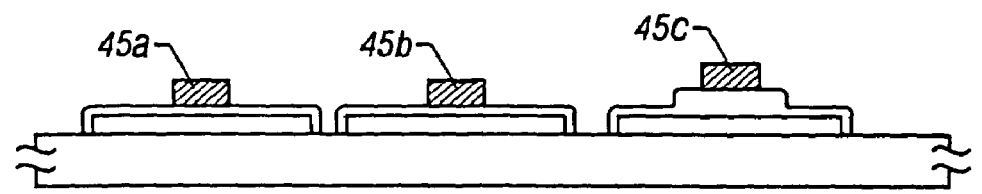

Following to that, an aluminum film of 4000 Å in thickness is deposited by means of sputtering. It is then etched to form gate electrodes 45a, 45b and 45c (FIG. 4D).

Figure 4E:
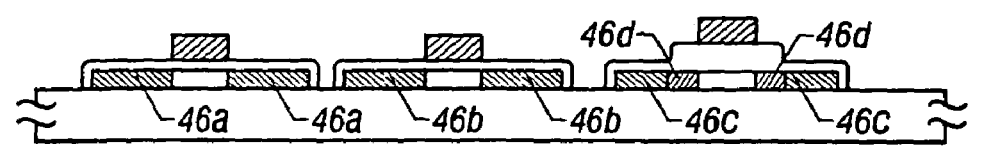

Next, impurities (phosphorus and boron) are implanted to the silicon region by using the gate electrodes as a mask by means of known ion doping. At this time, two-stage doping is implemented by changing acceleration voltage similarly to the second embodiment to form an N-type low concentration impurity region 46d in addition to a P-type high concentration impurity region 46a and N-type high concentration impurity regions 46b and 46c (FIG. 4E).

After activating the impurities, a silicon oxide film 47 of 6000 Å in thickness is formed as an interlayer insulator. Contact holes are formed therethrough and electrode/wires 48a and 48b for the logic circuit and an electrode/wire 48c for the matrix circuit are formed by aluminum.

Figure 4F:
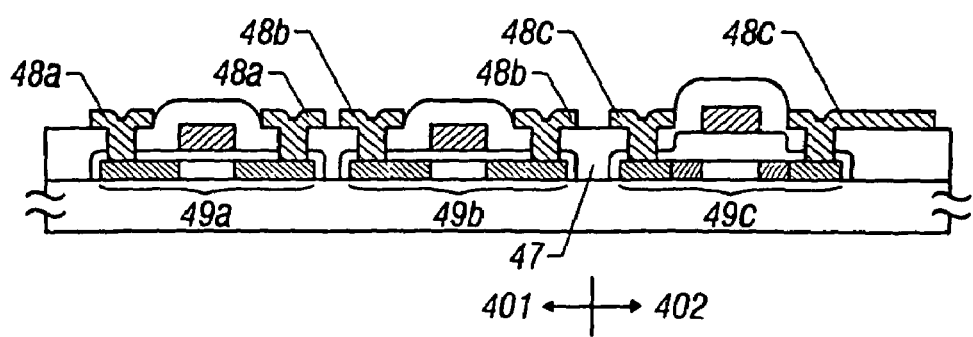

Through the above-mentioned steps, a semiconductor integrated circuit having a P-channel type TFT 49a and an N-channel type TFT 49b of the logic circuit and a TFT 49c of the matrix circuit is completed (FIG. 4F).

[Fifth Embodiment]

FIGS. 5A through 5F are section views showing a fabrication process according to the present embodiment. In FIGS. 5A through 5F, a logic circuit 501 is formed on the left side of the paper and a matrix circuit 502 on the right side. At first, an intrinsic (I-type) crystalline silicon film of 600 Å in thickness is formed on a substrate (quartz) 51. The silicon film is then separated into islands to form island regions 52a and 52b for TFTs of a logic circuit and an island region 52c for a TFT of a matrix circuit.

Figure 5A:
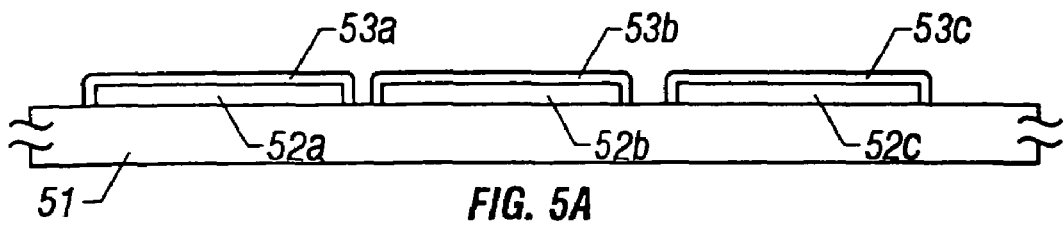
FIGS. 5A through 5F are section views showing a fabrication process according to a fifth embodiment.

Further, silicon oxide films 53a, 53b and 53c of 500 Å in thickness are formed by means of thermal oxidation (FIG. 5A).

Figure 5B:
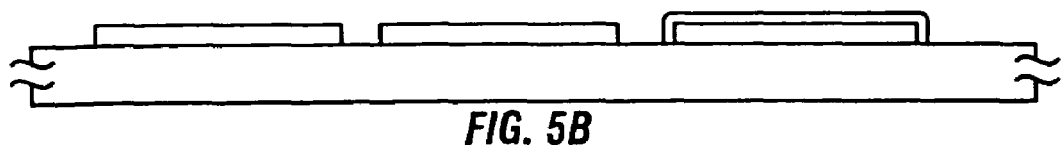

Next, the silicon oxide films 53a and 53b existing on the part of the logic circuit are etched (FIG. 5B).

Figure 9A:
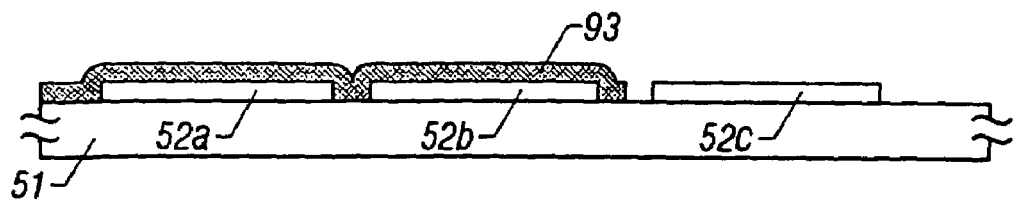
FIGS. 9A through 9C are section views of the fabrication process of the fifth embodiment using a resist film to selectively obtain a thermal oxide film.
Figure 9B:
Figure 9C:
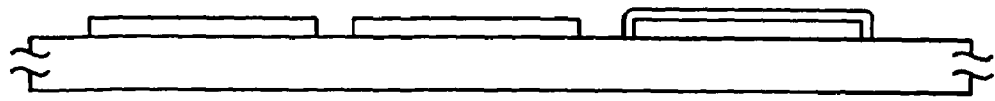

The state shown in FIG. 5B obtained by the steps so far can be obtained also by forming a resist film 93 except the part of the logic circuit after separating the silicon film into the islands (FIG. 9A), by implementing the thermal oxidation (FIG. 9B) and then by removing the resist film (FIG. 9C).

Figure 5C:
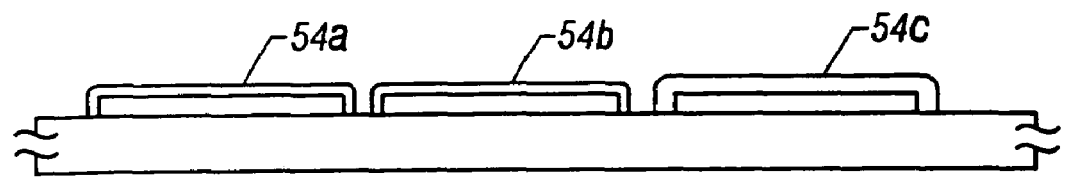

Following to that, a gate insulating film of silicon oxide is formed on the surface of the silicon region by implementing another thermal oxidation at 950° C. At this time, the silicon oxide is formed to be 400 Å in thickness in the logic circuit region thermally oxidized in the state in which the silicon layer has been exposed. Thus, gate insulating films 54a, 54b and 54c are obtained (FIG. 5C).

Figure 5D:
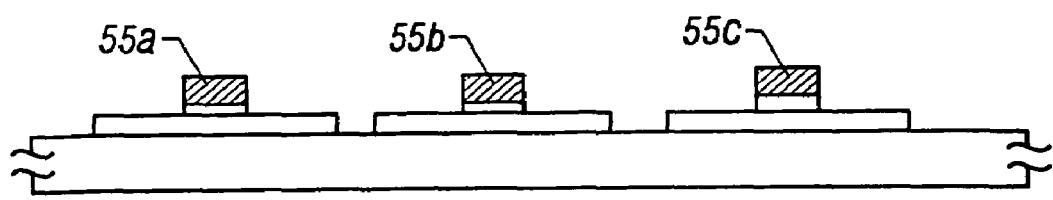

Following to that, an aluminum film of 4000 Å in thickness is deposited by means of sputtering. It is then etched to form gate electrodes 55a, 55b and 55c. Further, the gate insulating films 54a, 54b and 54c are etched by using the gate electrodes as a mask (FIG. 5D).

Figure 5E:
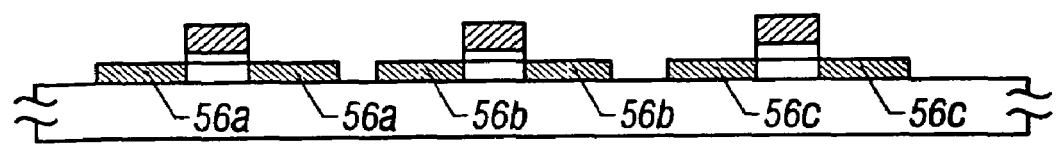

Next, impurities (phosphorus and boron) are implanted to the silicon region by using the gate electrodes as a mask by means of known ion doping. Then, a P-type impurity region 56a and N-type impurity regions 56b and 56c are formed (FIG. 5E).

After activating the impurities, a silicon oxide film 57 of 6000 Å in thickness is formed as an interlayer insulator. Contact holes are formed therethrough and electrode/wires 58a and 58b for the logic circuit and an electrode/wire 58c for the matrix circuit are formed by aluminum.

Figure 5F:
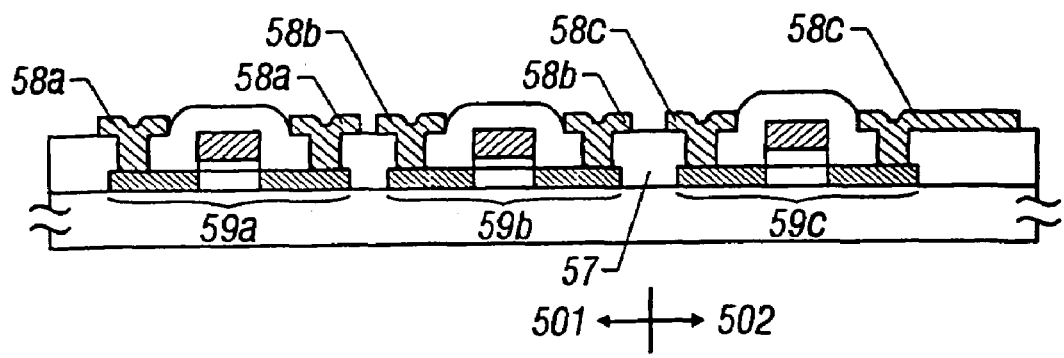

Through the above-mentioned steps, a semiconductor integrated circuit having a P-channel type TFT 59a and an N-channel type TFT 59b of the logic circuit and a TFT 59c of the matrix circuit is completed (FIG. 5F).

[Sixth Embodiment]

FIGS. 6A through 6F are section views showing a fabrication process according to the present embodiment. In FIGS. 6A through 6F, a logic circuit 601 is formed on the left side of the paper and a matrix circuit 602 on the right side. At first, an intrinsic (I-type) crystalline silicon film of 600 Å in thickness is formed on a substrate (quartz) 61. The silicon film is then separated into islands to form island regions 62a and 62b for TFTs of a logic circuit and an island region 62c for a TFT of a matrix circuit.

Figure 6A:
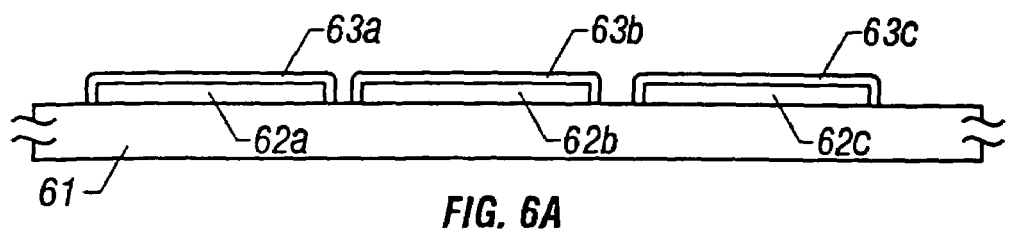
FIGS. 6A through 6F are section views showing a fabrication process according to a sixth embodiment.

Further, silicon oxide films 63a, 63b and 63c of 500 Å in thickness are formed by means of thermal oxidation (FIG. 6A).

Figure 6B:
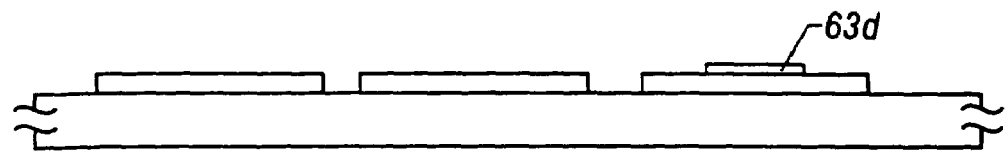

Next, the silicon oxide films 63a and 63b existing on the part of the logic circuit are etched. The silicon oxide film 63c at the matrix circuit is left (FIG. 6B).

Next, the silicon oxide films 63a, 63b and 63c are etched except the silicon oxide film 63d at the part near the channel of the TFT of the matrix circuit. The silicon oxide film 63d is left up to the part having a width of 3 µm from the edge of a gate electrode to be formed later (FIG. 6B).

Figure 10C:
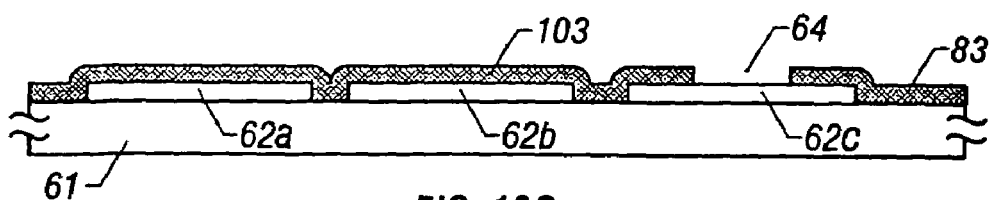
Figure 10B:
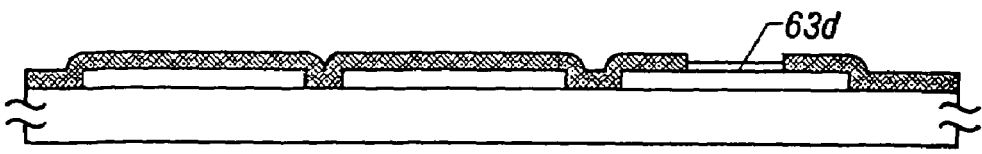
Figure 10C:
Figure 11A:
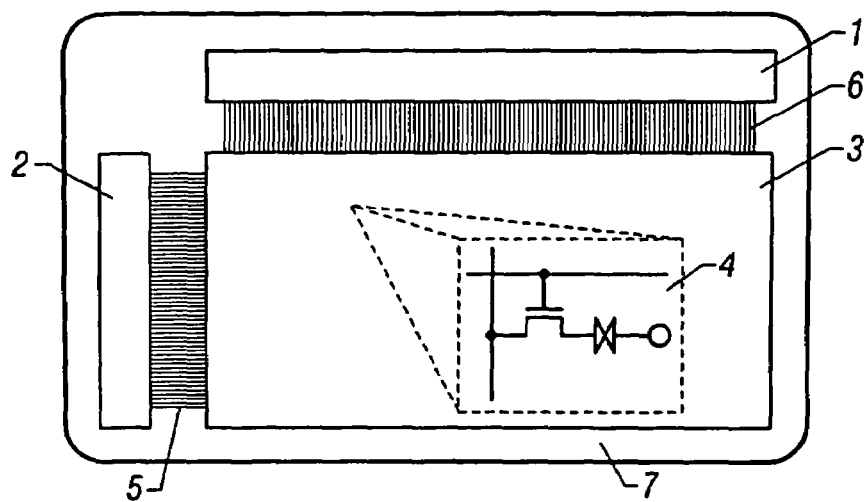
FIGS. 11A and 11B show structural examples of a monolithic active matrix circuit.
Figure 11B:
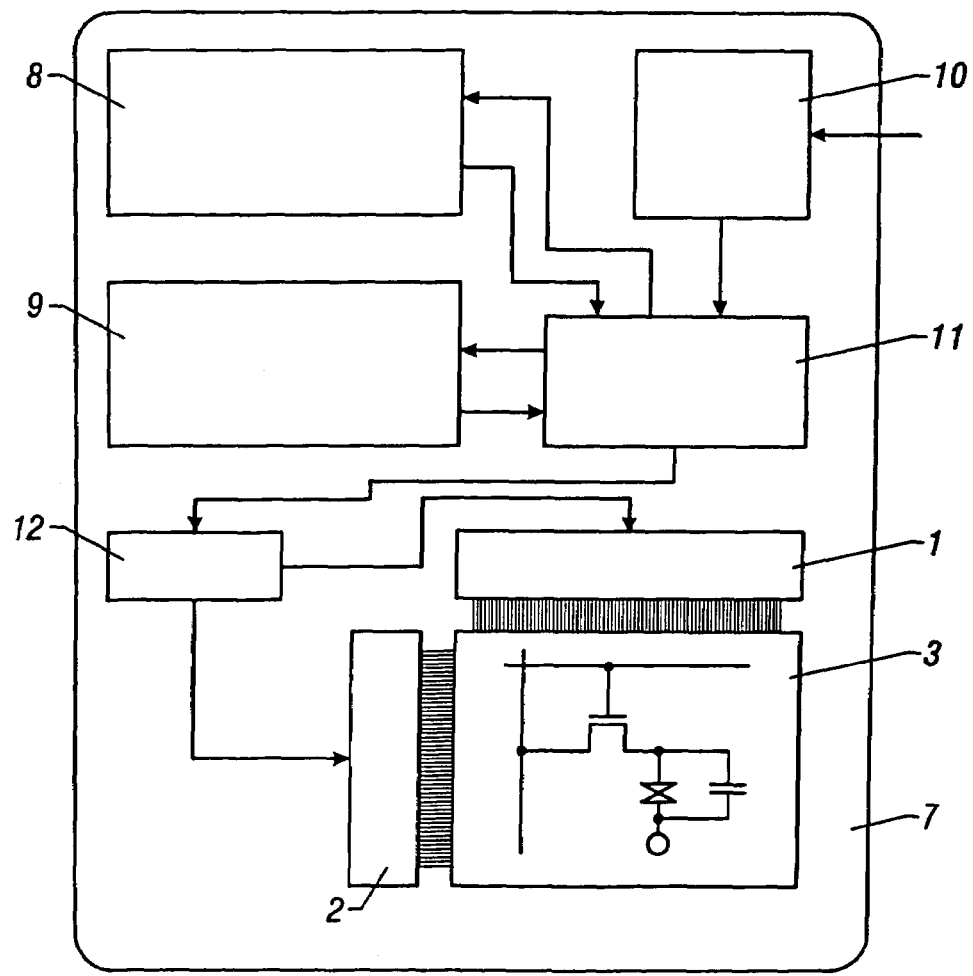

The state shown in FIG. 6B obtained by the steps so far can be obtained also by forming a resist film 103 except the part having the width of 3 µm from the edge of the gate electrode to be formed later after separating the silicon film into the islands (FIG. 10A), by implementing the thermal oxidation (FIG. 10B) and then by removing the resist film (FIG. 10C).

Figure 6C:
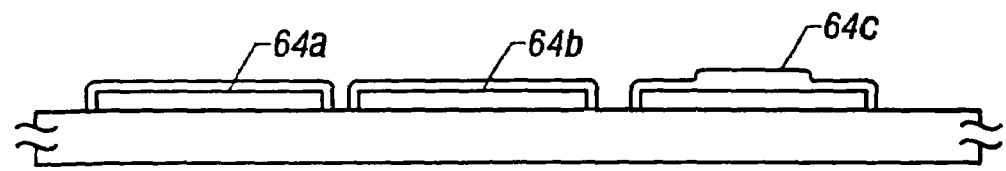

Following to that, a gate insulating film of silicon oxide is formed on the surface of the silicon region by implementing another thermal oxidation at 950° C. At this time, the silicon oxide is formed to be 400 Å in thickness in the part where the silicon layer is exposed. Thus, gate insulating films 64a, 64b and 64c are obtained (FIG. 6C).

Figure 6D:
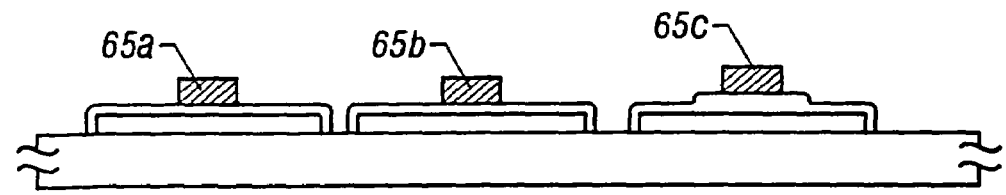

Next, an aluminum film of 4000 Å in thickness is deposited by means of sputtering. It is then etched to form gate electrodes 65a, 65b and 65c (FIG. 6D).

Figure 6E:
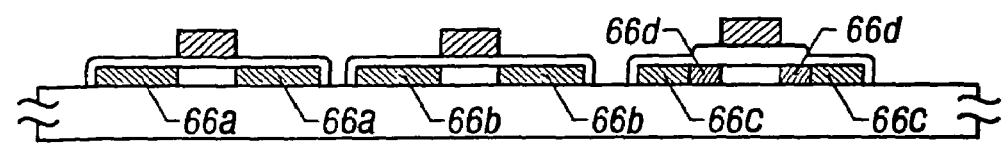

Next, impurities (phosphorus and boron) are implanted to the silicon region by using the gate electrodes as a mask by means of known ion doping. At this time, the two-stage doping is carried out by changing acceleration voltage similarly to the second or fourth embodiment to form an N-type low concentration impurity region 66d in addition to a P-type high concentration impurity region 66a and N-type high concentration impurity regions 66b and 66c (FIG. 6E).

After activating the impurities, a silicon oxide film 67 of 6000 Å in thickness is formed as an interlayer insulator. Contact holes are formed therethrough and electrode/wires 68a and 68b for the logic circuit and an electrode/wire 68c for the matrix circuit are formed by aluminum.

Figure 6F:
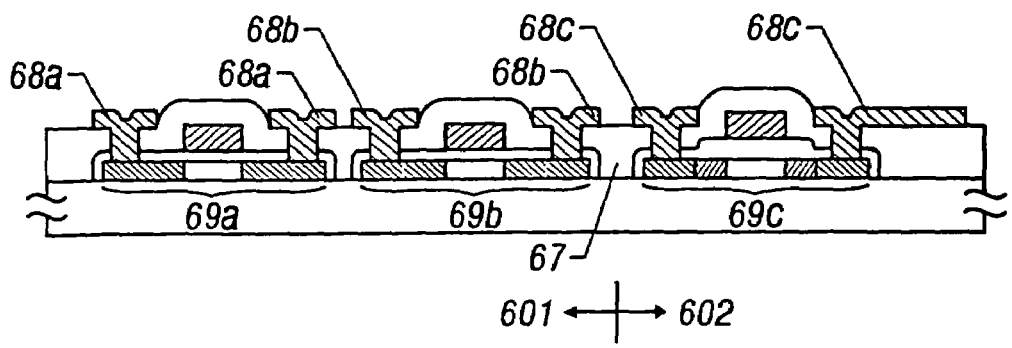

Through the above-mentioned steps, a semiconductor integrated circuit having a P-channel type TFT 69a and an. N-channel type TFT 69b of the logic circuit and a TFT 69c of the matrix circuit is completed (FIG. 6F).

[Seventh Embodiment]

While the case of thickening the gate insulating film of the matrix circuit has been shown in the third embodiment, a gate insulating film of circuits in which priority is given to high operating speed such as a shift register circuit, a CPU circuit, a decoder circuit, a memory circuit and others among peripheral circuits is thinned as compared to a gate insulating film of circuits in which priority is given to high withstand voltage such as a high withstand voltage switching circuit and a buffer circuit in the present embodiment.

The gate insulating film of the circuit in which priority is given to high operating speed among the peripheral circuits is thinned by using the same process with that in the third embodiment.

[Eighth Embodiment]

While the case of thinning the gate insulating film of the circuit in which priority is given to high operating speed has been shown in the seventh embodiment, a length of the channel is shortened further by reducing a width of a gate electrode of the circuit having the thin gate insulating film in the present embodiment.

The present embodiment shares the same process with the third embodiment up to the step of depositing the aluminum film of 4000 to 6000 Å, or 5000 Å in thickness for example, by means of sputtering after forming the silicon oxide film.

Figure 7A:
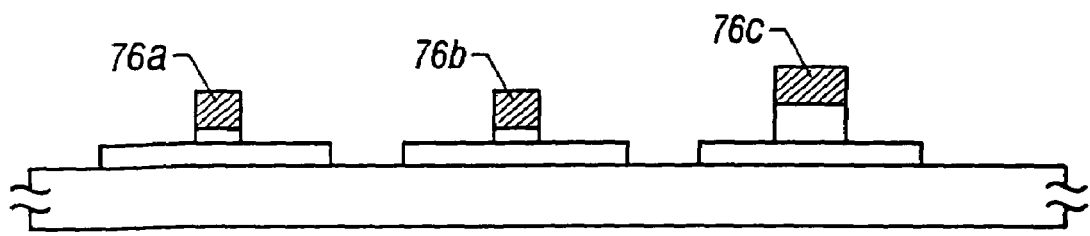
FIGS. 7A through 7C are section views showing a fabrication process according to an eighth embodiment.

In the present embodiment, with respect to the peripheral circuits 700, a width of gate electrodes 76a and 76b of the circuit 701 in which priority is given to high operating speed, for example, a shift register circuit, is reduced to 1 $\mu$m which is narrower than a width of a gate electrode 76 c (width: 2 $\mu$m) of the circuit 702 in which priority is given to high withstand voltage, for example, a buffer circuit, in an etching step thereafter (FIG. 7A).

Here, although the ratio of the width of the gate electrode of the circuit in which priority is given to high operating speed to the width of the gate electrode of the circuit in which priority is given to high withstand voltage has been 0.5 in the present embodiment, it is not limited to the value of the present embodiment so long as it is within a range of 0.1 to 0.5.

Figure 7B:
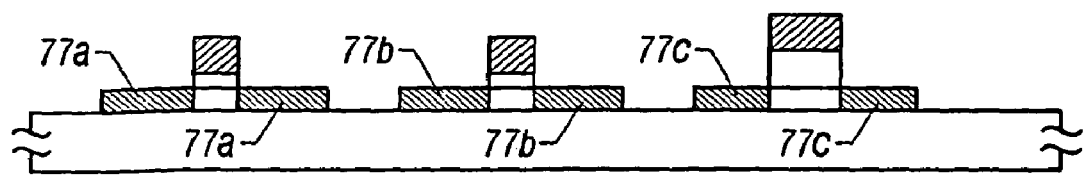

Next, impurities (phosphorus and boron) are implanted to the silicon region by using the gate electrodes as a mask by means of known ion doping to form a P-type impurity region 77a and N-type impurity regions 77b and 77c (FIG. 7B).

Through this step, the length of the channel of the circuit in which priority is given to high operating speed is reduced to 80% or less of the length of the channel of the circuit in which priority is given to high withstand voltage.

Further, a length of the channel formed in contact with the gate electrode formed in this step has almost the same length with the width of the gate electrode.

Accordingly, the ratio of the length of the channel of the circuit in which priority is given to high operating speed to that of the circuit in which priority is given to high withstand voltage becomes 0.5 similarly to the ratio of the width of the gate electrodes in the present embodiment. The ratio of the length of the channels is not also limited to the value of the present embodiment so long as it is within the range of 0.1 to 0.5, similarly to the width of the gate electrodes.

After activating the impurities, a silicon oxide film 78 of 4000 Å in thickness is formed as an interlayer insulator. Contact holes are formed therethrough and electrode/wires 79a and 79b for the circuit in which priority is given to high operating speed and an electrode/wire 79c for the circuit in which priority is given to high withstand voltage are formed by aluminum.

Figure 7C:
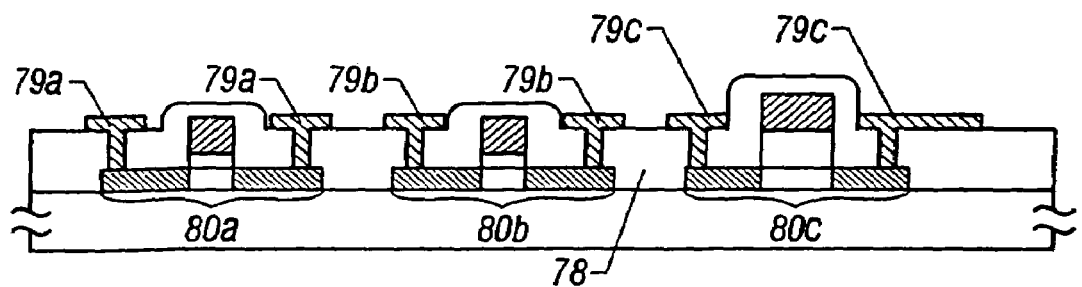

Through the above-mentioned steps, a semiconductor integrated circuit having a P-channel type TFT 80a and an N-channel type TFT 80b of the circuit in which priority is given to high operating speed and a TFT 80c of the circuit in which priority is given to high withstand voltage is completed (FIG. 7C).

The pixel electrode may be added in the manner as described in the second embodiment.

[Ninth Embodiment]

While the case of laminating the first and second gate insulating films in the matrix circuit has been shown in the first embodiment, a length of the channel is shortened by reducing the width of the gate electrode of the circuit in which only the first gate insulating film is used in the present embodiment.

The present embodiment shares the same process with the first embodiment up to the step of depositing the silicon film (containing 0.1 to 2% of phosphorus) of 3000 to 8000 Å, or 6000 Å in thickness for example, on the gate insulating film by means of the low pressure CVD.

Figure 8A:
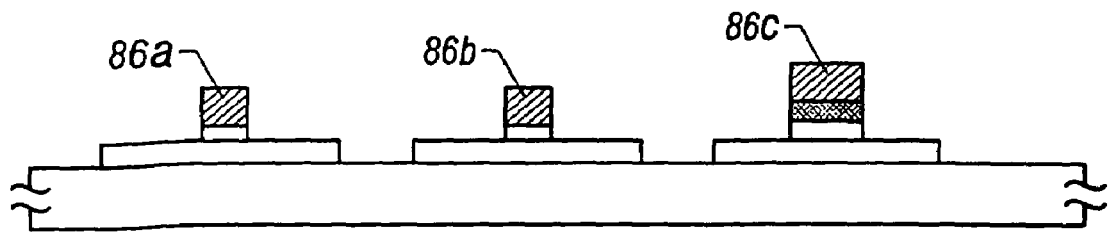
FIGS. 8A through 8C are section views showing a fabrication process according to a ninth embodiment.

In the present embodiment, with respect to the peripheral circuits 800, a width of gate electrodes 86a and 86b of the circuit 801 in which priority is given to high operating speed, for example, a shift register circuit, is reduced to 1 $\mu$m which is narrower than a width of a gate electrode 86 c (width: 2 $\mu$m) of the circuit 802 in which priority is given to high withstand voltage, for example, a buffer circuit, in an etching step thereafter (FIG. 8A).

Here, although the ratio of the width of the gate electrode of the circuit in which priority is given to high operating speed to the width of the gate electrode of the circuit in which priority is given to high withstand voltage has been 0.5 in the present embodiment, it is not limited to the value of the present embodiment so long as it is within a range of 0.1 to 0.5.

The first gate insulating layer and the second gate insulating layer are etched by using respective gate electrodes as a mask to expose the surface of the island semiconductor regions (FIG. 8A).

Figure 8B:
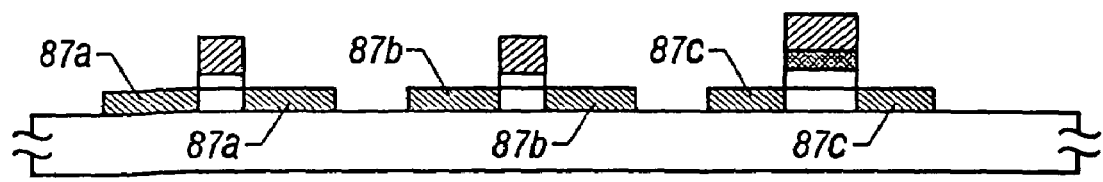

Next, impurities (phosphorus and boron) are implanted to the silicon region by using the gate electrodes as a mask by means of known ion doping. Phosphine ($PH_3$) and diborane ($B_2H_6$) are used as the doping gas and the dosage thereof is $1\times10^{15}$ to $8\times10^{15}$ cm$^{-2}$, e.g. $2\times10^{15}$ cm$^{-2}$ of phosphorus and $5\times10^{15}$ cm$^{-2}$ of boron. As a result, a P-type impurity region 87a and N-type impurity regions 87b and 87c are formed (FIG. 8B).

After activating the impurities, a silicon oxide film 88 of 4000 Å in thickness is formed as an interlayer insulator. Contact holes are formed therethrough and electrode/wires 89a and 89b for the circuit in which priority is given to high operating speed and an electrode/wire 89c for the circuit in which priority is given to high withstand voltage are formed by aluminum.

Figure 8C:
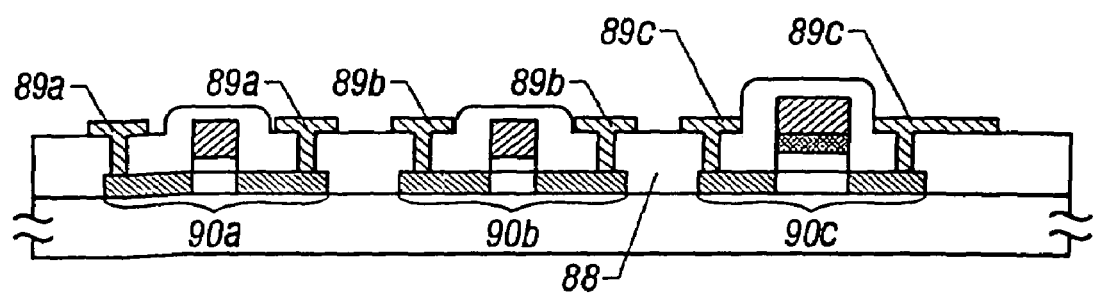

Through the above-mentioned steps, the semiconductor integrated circuit having a P-channel type TFT 90a and an N-channel type TFT 90b of the circuit in which priority is given to high operating speed and a TFT 90c of the circuit in which priority is given to high withstand voltage is completed (FIG. 8C).

Further, a length of the channel formed in contact with the gate electrode formed in this step has substantially the same width with that of the gate electrode. Accordingly, the ratio of the length of the channel of the circuit in which priority is given to high operating speed to that of the circuit in which priority is given to high withstand voltage is not also limited to the value of the present embodiment so long as it is within the range of 0.1 to 0.5, similarly to the width of the gate electrode of the present invention.

The pixel electrode may be added in the manner as described in the second embodiment.

[Tenth Embodiment]

A liquid crystal display fabricated by utilizing the present specification is called as a flat panel type display device. As such display device, there have been known ones using EL (electroluminescence) materials and using EC (electrochromic) materials, beside one utilizing the optical characteristics of liquid crystal. The invention disclosed in the present specification may be utilized in an active matrix type flat panel display which uses those materials and in which peripheral driving circuits and the like are integrated. The liquid crystal display (LCD) device manufactured using the present invention can be applied to either a transmission type or a reflection type.

Figure 12A:
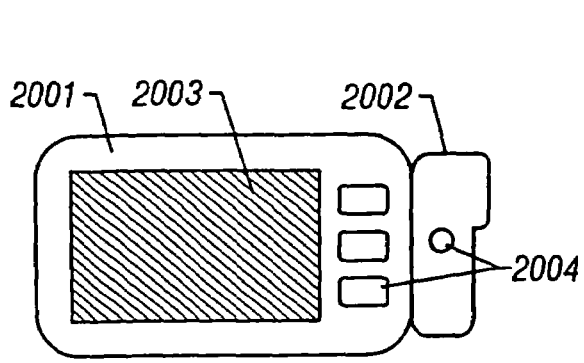
FIGS. 12A through 12D show examples of equipment using a flat panel display according to a tenth embodiment.

Such display may be utilized in the following uses. FIG. 12A shows an equipment called a digital still camera, an electronic camera or a video movie which can display motion pictures.

This equipment has functions of electronically keeping images taken by a CCD camera (or other adequate photographic means) disposed at a camera section 2002 and of displaying the images on a display device 2003 disposed within a main body 2001. The equipment may be manipulated by control buttons 2004.

The invention disclosed in the present specification may be utilized in the display device constructed as described above. Because power consumption may be saved by utilizing the invention disclosed in the present specification, it is useful for the portable equipment as shown in FIG. 12A which is supposed to be driven by a battery.

Figure 12B:
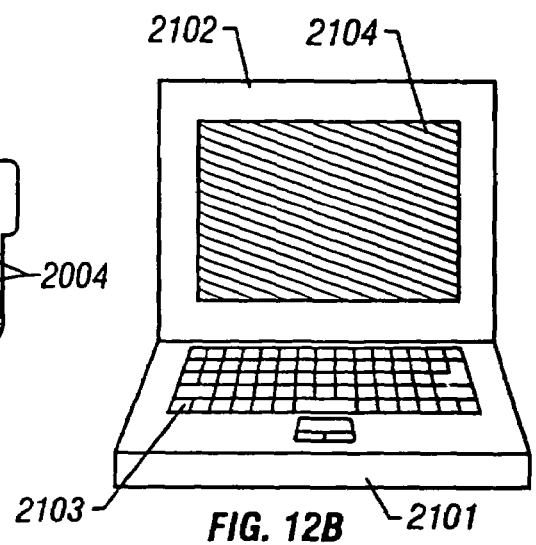

FIG. 12B shows a portable personal computer. This equipment is provided with a display device 2104 on an openable cover 2102 attached to a main body 2101 and allows to input various information from a key board 2103 and to run various operations.

It is also useful to utilize the invention disclosed in the present specification for the display device 2104 arranged as shown in FIG. 12B.

Figure 12C:
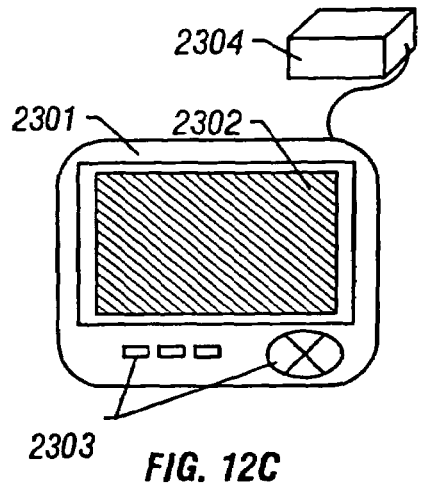

FIG. 12C shows a case when the flat panel display is utilized in a car navigation system. The car navigation system comprises an antenna section 2304 and a main body provided with a display 2302.

Switching of various information required in navigation is can be made by control buttons 2303. It is generally controlled by a remote control unit not shown.

Figure 12D:
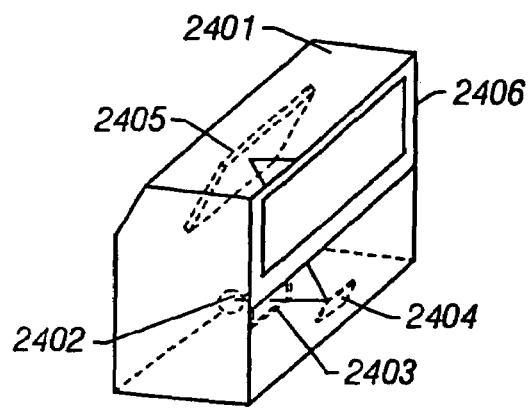

FIG. 12D shows a case of a projection type liquid crystal display. In the figure, light emitted from a light source 2402 is optically modulated by a liquid crystal display device 2403 and is turned into an image. The image is reflected by mirrors 2404 and 2405 to be projected on a screen 2406.

As shown in the above-mentioned embodiments, the present invention allows the TFT which can operate at high speed in low voltage and the TFT which is characterized by the high withstand voltage to be formed on one and the same substrate. Applying this to the liquid crystal display allows the reliability, the power consumption and the characteristics to be improved as a whole.

It is noted that the features and advantages of the present invention may be clearly understood if one notices on that the conventional semiconductor integrated circuit technology has not required to change the thickness of the gate insulating film actively like the present invention. In the conventional semiconductor integrated circuit (in digital circuits in particular), voltage to be used has been all the same within the circuit. For instance, the memory area and the peripheral circuit have been driven by single voltage in a DRAM.

However, a liquid crystal display requires a plurality of voltages because voltage suitable for the liquid crystal material differs from voltage suitable for driving transistors in the liquid crystal display. Generally, the former is higher than the latter.

If there is a plurality of voltages, dimensions of a transistors suited to that also have to be changed. The present invention has noticed on this point. Accordingly, the idea of the present invention would not be brought out from the technology of the conventional semiconductor integrated circuit driven by single voltage. Thus, the present invention is useful from the industrial point of view.

What is claimed is:

1. A camera comprising a display device, said display device comprising:
    a substrate having an insulating surface;
    a semiconductor layer over the substrate, said semiconductor layer including at least a channel region;
    a first insulating film comprising silicon oxide formed over the semiconductor layer;
    a second insulating film comprising silicon nitride formed over the first insulating film;
    a gate electrode located over the channel region of the semiconductor layer with the first insulating film and the second insulating film interposed therebetween;
    a third insulating film comprising silicon nitride formed over the semiconductor layer, the first and second insulating films and the gate electrode,
    wherein said second insulating film extends beyond edges of the gate electrode;
    wherein said first insulating film extends beyond edges of the second insulating film, and
    wherein said third insulating film is in direct contact with an upper surface of an extending portion of the first insulating film and an upper surface of an extending portion of the second insulating film.

2. A camera according to claim 1, further comprising a fourth insulating film formed over said third insulating film, wherein said fourth insulating film comprises an organic resin.

3. A camera according to claim 1,
    wherein said semiconductor layer includes a pair of impurity regions,
    wherein said semiconductor layer includes at least one lightly doped impurity region between the channel region and one of the pair of impurity regions.

4. A camera according to claim 1,
    wherein said display comprises a driving circuit formed over said substrate.

5. A camera comprising a display device, said display device comprising:
   a substrate having an insulating surface;
   a semiconductor layer over the substrate, said semiconductor layer including at least a pair of impurity regions and a channel region;
   a first insulating film comprising silicon oxide formed over the semiconductor layer;
   a second insulating film comprising silicon nitride formed over the first insulating film;
   a gate electrode located over the channel region of the semiconductor layer with the first insulating film and the second insulating film interposed therebetween;
   a third insulating film comprising silicon nitride formed over the semiconductor layer, the first and second insulating films and the gate electrode, said third insulating film having at least one contact hole;
   at least one of source and drain electrodes formed over said third insulating film,
   wherein said second insulating film extends beyond edges of the gate electrode,
   wherein said first insulating film extends beyond edges of the second insulating film, and
   wherein said third insulating film is in direct contact with an upper surface of an extending portion of the first insulating film and an upper surface of an extending portion of the second insulating film, and
   wherein said one of the source and drain electrodes is electrically connected to one of said pair of impurity regions through the contact hole, and
   wherein said one of the source and drain electrodes is not in direct contact with the second insulating film.

6. A camera according to claim 5, further comprising a fourth insulating film formed over said third insulating film, wherein said fourth insulating film comprises an organic resin.

7. A camera according to claim 5,
   wherein said second insulating film at least partly overlaps one lightly doped impurity region between the channel region and one of the pair of impurity regions.

8. A camera according to claim 5,
   wherein said display comprises a driving circuit formed over said substrate.

9. A camera comprising a display device, said display device comprising:
   a substrate having an insulating surface;
   a semiconductor layer over the substrate, said semiconductor layer including at least a channel region;
   a first insulating film comprising silicon oxide formed over the semiconductor layer;
   a second insulating film comprising silicon nitride formed over the first insulating film;
   a gate electrode located over the channel region of the semiconductor layer with the first insulating film and the second insulating film interposed therebetween;
   a third insulating film comprising silicon nitride formed over the semiconductor layer, the first and second insulating films and the gate electrode,
   wherein said second insulating film extends beyond edges of the gate electrode;
   wherein said first insulating film extends beyond edges of the second insulating film, and
   wherein said third insulating film is in direct contact with an upper surface of an extending portion of the first insulating film and an upper surface of an extending portion of the second insulating film, and
   wherein said third insulating film is in direct contact with an upper surface of the gate electrode and side surfaces of the gate electrode.

10. A camera according to claim 9, further comprising a fourth insulating film formed over said third insulating film, wherein said fourth insulating film comprises an organic resin.

11. A camera according to claim 9,
    wherein said second insulating film at least partly overlaps one lightly doped impurity region between the channel region and one of the pair of impurity regions.

12. A camera according to claim 9,
    wherein said display comprises a driving circuit formed over said substrate.

13. A camera comprising a display device, said display device comprising:
    a substrate having an insulating surface;
    a semiconductor layer over the substrate, said semiconductor layer including at least a pair of impurity regions and at least one lightly doped impurity region between the channel region and one of the pair of impurity regions;
    a first insulating film comprising silicon oxide formed over the semiconductor layer;
    a second insulating film comprising silicon nitride formed over the first insulating film;
    a gate electrode located over the channel region of the semiconductor layer with the first insulating film and the second insulating film interposed therebetween;
    a third insulating film comprising silicon nitride formed over the semiconductor layer, the first and second insulating films and the gate electrode,
    wherein said second insulating film extends beyond edges of the gate electrode;
    wherein said first insulating film extends beyond edges of the second insulating film, and
    wherein said third insulating film is in direct contact with an upper surface of an extending portion of the first insulating film and an upper surface of an extending portion of the second insulating film,
    wherein said second insulating film overlaps said lightly doped impurity region.

14. A camera according to claim 13, further comprising a fourth insulating film formed over said third insulating film, wherein said fourth insulating film comprises an organic resin.

15. A camera according to claim 13,
    wherein said display comprises a driving circuit formed over said substrate.

16. A camera comprising a display device, said display device comprising:
    a substrate having an insulating surface;
    a semiconductor layer over the substrate, said semiconductor layer including at least a pair of impurity regions and a channel region;
    a first insulating film comprising silicon oxide formed over the semiconductor layer;
    a second insulating film comprising silicon nitride formed over the first insulating film;
    a gate electrode located over the channel region of the semiconductor layer with the first insulating film and the second insulating film interposed therebetween;
    a third insulating film comprising silicon nitride formed over the semiconductor layer, the first and second insulating films and the gate electrode, said third insulating film having at least one contact hole;

at least one of source and drain electrodes formed over said third insulating film, wherein said second insulating film extends beyond edges of the gate electrode, wherein said first insulating film extends beyond edges of the second insulating film, and wherein said third insulating film is in direct contact with an upper surface of an extending portion of the first insulating film and an upper surface of an extending portion of the second insulating film, and wherein said one of the source and drain electrodes is electrically connected to one of said pair of impurity regions through the contact hole, and wherein said one of the source and drain electrodes is not in direct contact with the second insulating film, and wherein said third insulating film is in direct contact with an upper surface of the gate electrode and side surfaces of the gate electrode.

17. A camera according to claim 16, further comprising a fourth insulating film formed over said third insulating film,
wherein said fourth insulating film comprises an organic resin.

18. A camera according to claim 16,
wherein said second insulating film at least partly overlaps one lightly doped impurity region between the channel region and one of the pair of impurity regions.

19. A camera according to claim 16,
wherein said display comprises a driving circuit formed over said substrate.

20. A camera comprising a display device, said display device comprising:
a substrate having an insulating surface;
a semiconductor layer over the substrate, said semiconductor layer including at least a pair of impurity regions and a channel region;
a first insulating film comprising silicon oxide formed over the semiconductor layer;
a second insulating film comprising silicon nitride formed over the first insulating film;
a gate electrode located over the channel region of the semiconductor layer with the first insulating film and the second insulating film interposed therebetween;
a third insulating film comprising silicon nitride formed over the semiconductor layer, the first and second insulating films and the gate electrode;
a fourth insulating film formed over said third insulating film comprises an organic resin;
a pixel electrode formed over said fourth insulating film wherein said pixel electrode is electrically connected to one of said pair of impurity regions,
wherein said second insulating film extends beyond edges of the gate electrode;
wherein said first insulating film extends beyond edges of the second insulating film, and
wherein said third insulating film is in direct contact with an upper surface of an extending portion of the first insulating film and an upper surface of an extending portion of the second insulating film.

21. A camera according to claim 20,
wherein said display comprises a driving circuit formed over said substrate.

22. A camera comprising a display device, said display device comprising:
a substrate having an insulating surface;
a semiconductor layer over the substrate, said semiconductor layer including at least a pair of impurity regions and a channel region;
a first insulating film comprising silicon oxide formed over the semiconductor layer;
a second insulating film comprising silicon nitride formed over the first insulating film;
a gate electrode located over the channel region of the semiconductor layer with the first insulating film and the second insulating film interposed therebetween;
a third insulating film comprising silicon nitride formed over the semiconductor layer, the first and second insulating films and the gate electrode, said third insulating film having at least one contact hole, at least one of source and drain electrodes formed over said third insulating film;
a fourth insulating film formed over said third insulating film comprises an organic resin;
a pixel electrode formed over said fourth insulating film wherein said pixel electrode is electrically connected to one of said pair of impurity regions,
wherein said second insulating film extends beyond edges of the gate electrode;
wherein said first insulating film extends beyond edges of the second insulating film, and
wherein said third insulating film is in direct contact with an upper surface of an extending portion of the first insulating film and an upper surface of an extending portion of the second insulating film, and
wherein said one of the source and drain electrodes is electrically connected to one of said pair of impurity regions through the contact hole, and
wherein said one of the source and drain electrodes is not in direct contact with the second insulating film.

23. A camera according to claim 22,
wherein said second insulating film at least partly overlaps one lightly doped impurity region between the channel region and one of the pair of impurity regions.

24. A camera according to claim 22,
wherein said display comprises a driving circuit formed over said substrate.

25. A camera comprising a display device, said display device comprising:
a substrate having an insulating surface;
a semiconductor layer over the substrate, said semiconductor layer including at least a pair of impurity regions and a channel region;
a first insulating film comprising silicon oxide formed over the semiconductor layer;
a second insulating film comprising silicon nitride formed over the first insulating film;
a gate electrode located over the channel region of the semiconductor layer with the first insulating film and the second insulating film interposed therebetween;
a third insulating film comprising silicon nitride formed over the semiconductor layer, the first and second insulating films and the gate electrode;
a fourth insulating film formed over said third insulating film comprises an organic resin;
a pixel electrode formed over said fourth insulating film wherein said pixel electrode is electrically connected to one of said pair of impurity regions,
wherein said second insulating film extends beyond edges of the gate electrode;
wherein said first insulating film extends beyond edges of the second insulating film, and
wherein said third insulating film is in direct contact with an upper surface of an extending portion of the first insulating film and an upper surface of an extending portion of the second insulating film, and wherein said third insulating film is in direct contact with an upper surface of the gate electrode and side surfaces of the gate electrode.

26. A camera according to claim 25,
wherein said second insulating film at least partly overlaps one lightly doped impurity region between the channel region and one of the pair of impurity regions.

27. A camera according to claim 25,
wherein said display comprises a driving circuit formed over said substrate.

28. A camera comprising a display device, said display device comprising:
  a substrate having an insulating surface;
  a semiconductor layer over the substrate, said semiconductor layer including at least a pair of impurity regions and at least one lightly doped impurity region between the channel region and one of the pair of impurity regions;
  a first insulating film comprising silicon oxide formed over the semiconductor layer;
  a second insulating film comprising silicon nitride formed over the first insulating film;
  a gate electrode located over the channel region of the semiconductor layer with the first insulating film and the second insulating film interposed therebetween;
  a third insulating film comprising silicon nitride formed over the semiconductor layer, the first and second insulating films and the gate electrode;
  a fourth insulating film formed over said third insulating film comprises an organic resin;
  a pixel electrode formed over said fourth insulating film wherein said pixel electrode is electrically connected to one of said pair of impurity regions,
  wherein said second insulating film extends beyond edges of the gate electrode,
  wherein said first insulating film extends beyond edges of the second insulating film, and
  wherein said third insulating film is in direct contact with an upper surface of an extending portion of the first insulating film and an upper surface of an extending portion of the second insulating film,
  wherein said second insulating film overlaps said lightly doped impurity region.

29. A camera according to claim 28,
wherein said display comprises a driving circuit formed over said substrate.

30. A camera comprising a display device, said display device comprising:
  a substrate having an insulating surface;
  a semiconductor layer over the substrate, said semiconductor layer including at least a pair of impurity regions and a channel region;
  a first insulating film comprising silicon oxide formed over the semiconductor layer;
  a second insulating film comprising silicon nitride formed over the first insulating film;
  a gate electrode located over the channel region of the semiconductor layer with the first insulating film and the second insulating film interposed therebetween;
  a third insulating film comprising silicon nitride formed over the semiconductor layer, the first and second insulating films and the gate electrode, said third insulating film having at least one contact hole;
  at least one of source and drain electrodes formed over said third insulating film;
  a fourth insulating film formed over said third insulating film comprises an organic resin;
  a pixel electrode formed over said fourth insulating film wherein said pixel electrode is electrically connected to one of said pair of impurity regions,
  wherein said second insulating film extends beyond edges of the gate electrode,
  wherein said first insulating film extends beyond edges of the second insulating film, and
  wherein said third insulating film is in direct contact with an upper surface of an extending portion of the first insulating film and an upper surface of an extending portion of the second insulating film, and
  wherein said one of the source and drain electrodes is electrically connected to one of said pair of impurity regions through the contact hole, and
  wherein said one of the source and drain electrodes is not in direct contact with the second insulating film, and
  wherein said third insulating film is in direct contact with an upper surface of the gate electrode and side surfaces of the gate electrode.

31. A camera according to claim 30,
wherein said second insulating film at least partly overlaps one lightly doped impurity region between the channel region and one of the pair of impurity regions.

32. A camera according to claim 30,
wherein said display comprises a driving circuit formed over said substrate.

* * * * *